(12) United States Patent
Huang et al.

(10) Patent No.: US 7,615,862 B2
(45) Date of Patent: Nov. 10, 2009

(54) HEAT DISSIPATING PACKAGE STRUCTURE AND METHOD FOR FABRICATING THE SAME

(75) Inventors: Chien-Ping Huang, Taichung (TW); Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 208 days.

(21) Appl. No.: 11/161,882

(22) Filed: Aug. 19, 2005

(65) Prior Publication Data
US 2006/0081978 A1 Apr. 20, 2006

(30) Foreign Application Priority Data
Oct. 20, 2004 (TW) ............... 93131775 A

(51) Int. Cl.
H01L 23/34 (2006.01)
H01L 23/10 (2006.01)
(52) U.S. Cl. .............. 257/707; 257/E23.104; 257/706; 257/712; 257/720; 438/122; 438/126; 361/709
(58) Field of Classification Search .......... 257/E23.108, 257/E23.111, E23.11, 704–707, 712, 720, 257/E23.124, E23.105, E21.499, E23.092, 257/E23.104, 783; 438/122, 124, 126; 361/709, 361/676
See application file for complete search history.

(56) References Cited

U.S. PATENT DOCUMENTS

| | | | |
|---|---|---|---|
| 4,803,546 A * | 2/1989 | Sugimoto et al. ............ 257/707 |
| 5,045,922 A * | 9/1991 | Kodama et al. ............. 257/698 |
| 5,081,067 A * | 1/1992 | Shimizu et al. ........... 228/123.1 |
| 5,523,586 A * | 6/1996 | Sakurai ...................... 257/48 |
| 5,656,864 A * | 8/1997 | Mitsue et al. ............... 257/787 |
| 5,726,079 A | 3/1998 | Johnson ...................... 438/106 |
| 5,895,972 A * | 4/1999 | Paniccia ..................... 257/706 |
| 5,909,057 A * | 6/1999 | McCormick et al. ........ 257/704 |
| 5,982,621 A * | 11/1999 | Li .............................. 361/704 |
| 5,986,459 A * | 11/1999 | Fukaya et al. ............... 324/755 |
| 6,117,352 A * | 9/2000 | Weaver et al. ............... 216/105 |
| 6,166,914 A * | 12/2000 | Sugiyama et al. ........... 361/737 |
| 6,229,702 B1 * | 5/2001 | Tao et al. .................... 361/704 |
| 6,232,152 B1 * | 5/2001 | DiStefano et al. ........... 438/124 |
| 6,232,652 B1 * | 5/2001 | Matsushima ................ 257/667 |
| 6,278,182 B1 * | 8/2001 | Liu et al. .................... 257/712 |
| 6,294,831 B1 * | 9/2001 | Shishido et al. ............. 257/729 |
| 6,432,749 B1 * | 8/2002 | Libres ........................ 438/122 |
| 6,444,498 B1 | 9/2002 | Huang et al. ................ 438/126 |
| 6,458,626 B1 | 10/2002 | Huang et al. ................ 438/112 |
| 6,506,626 B1 * | 1/2003 | Chiu .......................... 438/108 |
| 6,507,116 B1 * | 1/2003 | Caletka et al. .............. 257/778 |
| 6,541,310 B1 * | 4/2003 | Lo et al. ..................... 438/122 |

(Continued)

*Primary Examiner*—Chris C Chu

(57) ABSTRACT

A heat dissipating package structure includes a chip carrier; a semiconductor chip mounted and electrically connected to the chip carrier; a heat spreader having a first surface, an opposed second surface and a hollow structure, the second surface of the heat spreader being mounted on the chip, wherein the chip is larger in size than the hollow structure such that the chip is partly exposed to the hollow structure; an encapsulant formed between the heat spreader and the chip carrier, for encapsulating the chip, wherein the first surface and sides of the heat spreader are exposed from the encapsulant to dissipate heat produced from the chip; and a plurality of conductive elements disposed on the chip carrier, for electrically connecting the chip to an external device. The present invention also provides a method for fabricating the heat dissipating package structure.

7 Claims, 16 Drawing Sheets

U.S. PATENT DOCUMENTS

| | | | |
|---|---|---|---|
| 6,614,102 B1 * | 9/2003 | Hoffman et al. | 257/666 |
| 6,654,248 B1 * | 11/2003 | Fishley et al. | 361/704 |
| 6,699,731 B2 | 3/2004 | Huang et al. | 438/108 |
| 6,716,676 B2 * | 4/2004 | Chen et al. | 438/122 |
| 6,891,259 B2 * | 5/2005 | Im et al. | 257/687 |
| 7,015,577 B2 * | 3/2006 | Wang | 257/707 |
| 7,163,840 B2 * | 1/2007 | Chen et al. | 438/108 |
| 2002/0195701 A1 * | 12/2002 | Bemmerl et al. | 257/706 |
| 2003/0183909 A1 * | 10/2003 | Chiu | 257/667 |

* cited by examiner

HEAT DISSIPATING PACKAGE STRUCTURE AND METHOD FOR FABRICATING THE SAME

FIELD OF THE INVENTION

The present invention relates to semiconductor packages and fabrication methods thereof, and more particularly, to a Ball Grid Array (BGA) package structure with a heat spreader, and a method for fabricating the BGA package structure.

BACKGROUND OF THE INVENTION

Ball Grid Array (BGA) semiconductor package is characterized with a semiconductor chip being mounted on a front surface of a substrate and a grid array of solder balls being implanted on a back surface of the substrate, such that more I/O (input/output) connections can be incorporated within the same unit area of a chip carrier (e.g. the substrate) to satisfy a high-integration requirement for the semiconductor chip, and the entire package unit can be electrically connected to an external printed circuit board via the solder balls.

As a large amount of heat is produced during operation of the highly integrated semiconductor chip, to effectively dissipate the heat is important to assure the performance and lifetime of the semiconductor chip. However, since the semiconductor chip is usually encapsulated by an encapsulant made of a resin material having poor thermal conductivity (a coefficient of thermal conductivity thereof is only 0.8 w/m-k), the heat from the semiconductor chip cannot be effectively dissipated through the encapsulant, thereby causing unsatisfactory heat dissipating efficiency and adversely affecting the performance and lifetime of the semiconductor chip.

In order to improve the heat dissipating efficiency of the BGA semiconductor package, a thermally enhanced package incorporated with a heat dissipating structure has been proposed.

FIG. 1 shows a semiconductor package 1 disclosed by U.S. Pat. No. 5,726,079, wherein a heat spreader 11 is directly attached to a chip 10, and a top surface 11a of the heat spreader 11 is exposed to the atmosphere from an encapsulant 12 that encapsulates the chip 10, such that heat generated by the chip 10 can be transferred to the heat spreader 11 and dissipated to the atmosphere without passing through the encapsulant 12 having poor thermal conductivity.

However, several drawbacks are induced during fabrication of the semiconductor package 1. Firstly, after the heat spreader 11 is attached to the chip 10, the combined structure of heat spreader 11 and chip 10 is placed into a mold cavity of an encapsulation mold, and a molding process is performed to form the encapsulant 12. The top surface 11a of the heat spreader 11 should abut against a top wall of the mold cavity to allow the top surface 11a to be exposed after molding. If the top surface 11a of the heat spreader 11 fails to effectively abut against the top wall of the mold cavity but leaves gaps therebetween, the encapsulant 12 would flash to the top surface 11a of the heat spreader 11, and the flashes not only deteriorate the heat dissipating efficiency but also impair appearance of the fabricated product. As such, a deflashing process is usually required to remove the flashes, which however prolongs the fabrication time, increases the fabrication costs and possibly damages the fabricated product. On the other hand, if the heat spreader 11 abuts against the top wall of the mold cavity too closely, the fragile chip 10 may be cracked due to excessive pressure applied thereto.

In particular, when a distance between the top surface 11a of the heat spreader 11 and an upper surface of a substrate 13 mounted with the chip 10 is larger than a depth of the mold cavity, the heat spreader 11 is pressed by the encapsulation mold during the molding process such that the chip 10 directly in contact with the heat spreader 11 is cracked. On the contrary, when the distance between the top surface 11a of the heat spreader 11 and the upper surface of the substrate 13 is smaller than the depth of the mold cavity, the encapsulant 12 flashes to the top surface 11a of the heat spreader 11, and the flashes deteriorate the heat dissipating efficiency due to decrease in area of the top surface 11a of the heat spreader 11 exposed to the atmosphere, such that the deflashing process is additionally performed to remove the flashes from the heat spreader 11.

In order to make the distance between the top surface 11a of the heat spreader 11 and the upper surface of the substrate 13 equal to the depth of the mold cavity, the attachment between chip 10 and heat spreader 11 or substrate 13 and the thickness of heat spreader 11 should be precisely performed and controlled, respectively. The precision requirement however increases the packaging costs and process complexity in fabrication, thereby having difficulty in practical implementation.

As a height of the combined structure of heat spreader 11 and chip 10 should be precisely controlled, a batch-type method is not suitably applied for attaching the heat spreader 11 to the chip 10 during fabrication of the semiconductor package 1. Thereby, the heat spreader 11 must be attached to the corresponding chip 10 one by one, making process complexity and time consumption in fabrication increased and not favorable for cost reduction and improvement in packaging efficiency.

The heat dissipating efficiency of the semiconductor package 1 is proportional to the exposed area of the top surface 11a of the heat spreader 11. Under a condition with a constant size of the semiconductor package 1, the heat spreader 11 when having the same surface area as that of the semiconductor package 1 would have the maximum exposed area to provide the maximum heat dissipating efficiency. In order to make the heat spreader have the same surface area as that of the semiconductor package, sides of the heat spreader should be flush or engaged with side walls of the mold cavity during the molding process. However, if the heat spreader is oversized due to fabrication inaccuracy, it cannot be successfully placed into the mold cavity; otherwise, if the heat spreader is undersized, the encapsulant would easily flash to the top surface or sides of the heat spreader. This structural arrangement causes a yield concern and difficulty in fabrication.

In light of the foregoing drawbacks, U.S. Pat. Nos. 6,458, 626 and 6,444,498 disclose a semiconductor package with a heat spreader being directly attached to a chip without causing chip cracking or flashes on an exposed surface of the heat spreader, as shown in FIGS. 2A to 2C and FIG. 3. In the semiconductor package, an interface layer 25 is formed on a surface, to be exposed to the atmosphere, of a heat spreader 21, and the interface layer 25 has poor adhesion with an encapsulant 24 or the heat spreader 21. Then, the heat spreader 21 is directly attached to a chip 20 mounted on a substrate 23. A molding process is performed to form an encapsulant 24 for encapsulating the heat spreader 21, the chip 20 and the interface layer 25 on the heat spreader 21 (as shown in FIG. 2A). In this case, the depth of a mold cavity of an encapsulation mold used in the molding process is larger than the combined thickness of chip 20 and heat spreader 21, such that the encapsulation mold does not come into contact with and press the heat spreader 21 to crack the chip 20 during molding. A singulation process is then performed (as shown in FIG. 2B), and the encapsulant 24 located above the heat spreader 21 is removed. If the adhesion between the heat spreader 21 and the interface layer 25 (such as a plated gold layer) is larger than the adhesion between the interface layer 25 and the encapsulant 24, the interface layer 25 remains on the heat spreader 21 after the encapsulant 24 located above the heat spreader 21 is removed. Due to the poor adhesion between the interface layer 25 and the encapsulant 24, no residue of the encapsulant 24 is left on the heat spreader 21 (as shown in FIG. 2C), thereby no flash problem. On the contrary, if the adhesion between the interface layer 25 (such as an adhesive tape made of polyimide resin) and the heat spreader 21 is smaller than the adhesion between the interface layer 25 and the encapsulant 24, the interface layer 25 is removed together with removal of the encapsulant 24 located above the heat spreader 21 (as shown in FIG. 3), such that no flash of the encapsulant 24 occurs on the heat spreader 21.

In the above semiconductor package, an adhesive layer 26 is applied between the chip 20 and the heat spreader 21 to effectively attach the heat spreader 21 to the chip 20, wherein the adhesive layer 26 is usually made of a thermal grease for improving the heat dissipating performance of the chip 20. A coefficient of thermal conductivity of the thermal grease is about 3 w/m-k, which is larger than that of the encapsulant (about 0.8 w/m-k) but much smaller than that of the heat spreader made of copper (about 400 w/m-k). Therefore, heat generated during operation of the chip is still transferred through the less thermally conductive thermal grease to the heat spreader and then dissipated to the atmosphere, such that thermal resistance is increased and disadvantageous for heat dissipation.

As shown in FIGS. 4A to 4C, U.S. Pat. No. 6,699,731 provides a semiconductor package with exposed chip, wherein a chip 40 is mounted on a substrate 43 and a module plate 41 is attached to the chip 40 via a tape 42. A molding process is performed to form an encapsulant 44 for encapsulating the module plate 41 and the chip 40 (as shown in FIG. 4A). Subsequently, a singulation process is performed (as shown in FIG. 4B), and the tape 42, the module plate 41 and the encapsulant 44 above the chip 40 are removed to form the semiconductor package with exposed chip. This allows heat generated during operation of the chip 40 to be directly dissipated to the atmosphere.

However, during practical fabrication of the above semiconductor package, when the tape 42 is removed from the chip 40, residues of an adhesive material of the tape 42 may easily remain on the encapsulant 44, which not only impair appearance of the fabricated product but also require an additional cleaning process, thereby undesirably making the overall packaging processes complicated and the fabrication costs increased.

SUMMARY OF THE INVENTION

In view of the foregoing drawbacks in the conventional technology, an objective of the present invention is to provide a heat dissipating package structure and a method for fabricating the same, wherein a heat spreader is directly attached to a chip to improve the heat dissipating efficiency, and problems of chip cracking and flashes during a molding process are avoided so as to improve the yields of fabricated products.

Another objective of the present invention is to provide a heat dissipating package structure and a method for fabricating the same, wherein a chip is partly exposed outside to improve the heat dissipating efficiency.

Still another objective of the present invention is to provide a heat dissipating package structure and a method for fabricating the same, whereby the heat dissipating efficiency is not affected by an adhesive material for attachment between a chip and a heat spreader.

A further objective of the present invention is to provide a heat dissipating package structure and a method for fabricating the same, which can avoid residues of an adhesive material from being left on a surface of the package structure, thereby not impairing appearance of the package structure and not requiring an additional residue-removing process or additional costs.

A further objective of the present invention is to provide a heat dissipating package structure and a method for fabricating the same, whereby semiconductor packages integrated with heat spreaders and chips can be fabricated in a batch-type manner, so as to simplify the fabrication processes, reduce the packaging time, and decrease the fabrication costs.

A further objective of the present invention is to provide a heat dissipating package structure and a method for fabricating the same, whereby a process of attaching a heat spreader to a chip is performed without a concern of height control, thereby reducing the fabrication costs and improving the yields.

A further objective of the present invention is to provide a heat dissipating package structure and a method for fabricating the same, wherein an encapsulation mold used in a molding process is suitable for products of different sizes, without having to change the encapsulation mold in response to the products of different sizes, thereby reducing packaging costs and equipment management costs.

In accordance with the foregoing and other objectives, the present invention proposes a method for fabricating a heat dissipating package structure, comprising the steps of: mounting and electrically connecting at least one semiconductor chip to a chip carrier, providing a heat spreader having a hollow structure and attached to an interface layer, and mounting the heat spreader on the semiconductor chip, wherein the semiconductor chip is larger in size than the hollow structure of the heat spreader; performing a molding process to form an encapsulant for completely encapsulating the semiconductor chip mounted on the chip carrier and the heat spreader with the interface layer; performing a singulation process to remove peripheral non-electrical functional portions of a package unit after completing the molding process such that sides of the heat spreader are exposed, and removing the interface layer and a part of the encapsulant formed on the interface layer so as to expose the heat spreader and allow a non-active surface of the semiconductor chip to be partly exposed to the hollow structure of the heat spreader.

During the above fabrication method in the present invention, the chip carrier can be a substrate or a lead frame, and the semiconductor chip can be electrically connected to the chip carrier by a flip-chip technique or a wire-bonding technique. When using the flip-chip technique to electrically connect the semiconductor chip to the chip carrier, the heat spreader having the hollow structure can be directly attached to the non-active surface of the semiconductor chip. When using the wire-bonding technique to electrically connect the semiconductor chip to the chip carrier, a buffer pad having a similar coefficient of thermal expansion (CTE) to that of the semiconductor chip can firstly be mounted on an active surface of the semiconductor chip without interfering with the arrangement of bonding wires, and then the heat spreader having the hollow structure is attached to the buffer pad in a manner to partly expose the buffer pad to the hollow structure, such that the heat spreader does not come into contact with the bonding wires and a thermal stress effect would not be produced by the heat spreader to the semiconductor chip due to mismatch in CTE therebetween as the heat spreader is not directly attached to the semiconductor chip.

Further, a heat-dissipating structure can be mounted on the heat spreader by a thermally conductive adhesive layer, allowing the heat-dissipating structure to be extended to and come into contact with the exposed part of the semiconductor chip or buffer pad via the hollow structure of the heat spreader, such that heat produced by operation of the semiconductor chip can be dissipated through the heat-dissipating structure.

The fabrication method in the present invention can be carried out in a batch-type manner that a plurality of semiconductor chips are mounted on a matrix-type chip carrier module plate, and then after performing a process of attaching a heat spreader with an interface layer to the semiconductor chips and a molding process, a singulation process is performed to form a plurality of individual semiconductor packages integrated with heat spreaders, thereby favorable for mass production.

The present invention also proposes a heat dissipating package structure comprising: a chip carrier; a semiconductor chip mounted and electrically connected to the chip carrier; a heat spreader having a hollow structure and mounted on the semiconductor chip, wherein the semiconductor chip is larger in size than the hollow structure, such that the semiconductor chip is partly exposed to the hollow structure of the heat spreader; and an encapsulant formed between the heat spreader and the chip carrier and for encapsulating the semiconductor chip. The hollow structure of the heat spreader can have a flexible shape, and the heat spreader is not limited to having only one hollow structure. A surface of the heat spreader in contact with the encapsulant can be made uneven and/or subjected to a black oxidation treatment in order to enhance the bonding between the heat spreader and the encapsulant. A buffer pad may be provided between the semiconductor chip and the heat spreader having the hollow structure, with the buffer pad being partly exposed to the hollow structure, so as to reduce thermal stress generated from the heat spreader to the semiconductor chip due to mismatch in CTE therebetween as the heat spreader is not directly attached to the semiconductor chip.

In a preferred embodiment of the present invention, the chip carrier is a BGA substrate, wherein the substrate is formed with at least one opening for allowing bonding wires to pass therethrough so as to electrically connect the semiconductor chip to the substrate. A plurality of solder balls are implanted on a surface of the substrate not mounted with the semiconductor chip, and serve as media for electrically connecting the semiconductor chip to an external device.

In another preferred embodiment of the present invention, the chip carrier is a flip-chip substrate, wherein an upper surface of the substrate is formed with a plurality of array-arranged bond pads where a plurality of conductive bumps are bonded for electrically connecting the semiconductor chip to the substrate, and a lower surface of the substrate is implanted with a plurality of solder balls for providing electrical connection between the semiconductor chip and an external device.

In still another preferred embodiment of the present invention, the chip carrier is a Quad Flat Non-leaded (QFN) lead frame, allowing the semiconductor chip to be electrically connected to leads of the QFN lead frame by a flip-chip technique and subsequently electrically connected to an external device via the leads.

In a further preferred embodiment of the present invention, the chip carrier is a Land Grid Array (LGA) substrate, with a non-active surface of the semiconductor chip being mounted on the LGA substrate. The semiconductor chip is electrically connected to the LGA substrate by bonding wires, and is subsequently electrically connected to an external device via a plurality of metallic contacts formed on a bottom surface of the substrate.

In a further preferred embodiment of the present invention, the chip carrier is a BGA substrate, with a non-active surface of the semiconductor chip being mounted on the BGA substrate. The semiconductor chip is electrically connected to the BGA substrate by bonding wires, and is subsequently electrically connected to an external device via a plurality of solder balls formed on a bottom surface of the substrate.

In a further preferred embodiment of the present invention, the chip carrier is a QFN lead frame, with a non-active surface of the semiconductor chip being mounted on a die pad of the QFN lead frame. The semiconductor chip is electrically connected to leads of the QFN lead frame by bonding wires, and is subsequently electrically connected to an external device via the leads.

It should be noted that in the heat dissipating package structure and the method for fabricating the same according to the present invention, the selection of chip carrier and the manner of electrical connection between semiconductor chip and chip carrier can be flexibly combined and modified without departing from the scope of the present invention, and all the combinations and modifications are encompassed by the present invention.

Therefore, by the heat dissipating package structure and the method for fabricating the same in the present invention, a semiconductor chip is mounted and electrically connected to a chip carrier, and a heat spreader having a hollow structure and attached to an interface layer is mounted on the semiconductor chip, wherein the interface layer seals one side of the hollow structure of the heat spreader, and the semiconductor chip is larger in size than the hollow structure of the heat spreader. Preferably, a peripheral portion of the semiconductor chip is attached to the heat spreader and a central portion of the semiconductor chip is exposed to the hollow structure, so as to reduce thermal resistance from an adhesive layer between the semiconductor chip and the heat spreader and allow the semiconductor chip to directly come into contact with the atmosphere to thereby improve the heat dissipating efficiency. Then, a molding process is performed to form an encapsulant for completely encapsulating the semiconductor chip on the chip carrier and the heat spreader with the interface layer. A singulation process is performed to remove peripheral non-electrical functional portions of a package unit. Subsequently, a part of the encapsulant formed on the heat spreader is removed. As the interface layer has larger adhesion with the encapsulant than with the heat spreader, the interface layer and the part of the encapsulant on the interface layer can be removed together, without leaving any residue of the interface layer on the package unit, such that the heat spreader is directly exposed and the semiconductor chip is partly exposed to the hollow structure of the heat spreader, thereby improving the heat dissipating efficiency due to direct contact between the semiconductor chip and the atmosphere. Further, the present invention can be accomplished by a batch-type manner, thereby simplifying the fabrication processes, reducing the packaging time and costs, preventing chip cracking or flashes in the molding process to cause impair appearance of the fabricated product or increase in deflashing costs, and having no concern for height control during the process of attaching the heat spreader to the semiconductor chip and for changing an encapsulation mold in response to change of a product size. As a result, packaging costs and equipment management costs are reduced in the present invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

FIGS. 5A to 5G show steps of a method for fabricating a heat dissipating package structure according to a first preferred embodiment of the present invention.

Figure 1:
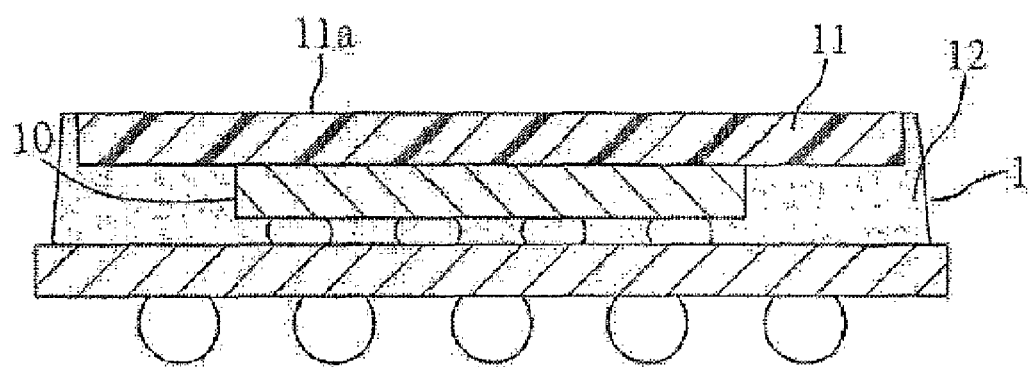
FIG. 1 (PRIOR ART) is a cross-sectional view of a semiconductor package disclosed in U.S. Pat. No. 5,726,079.
Figure 2A:
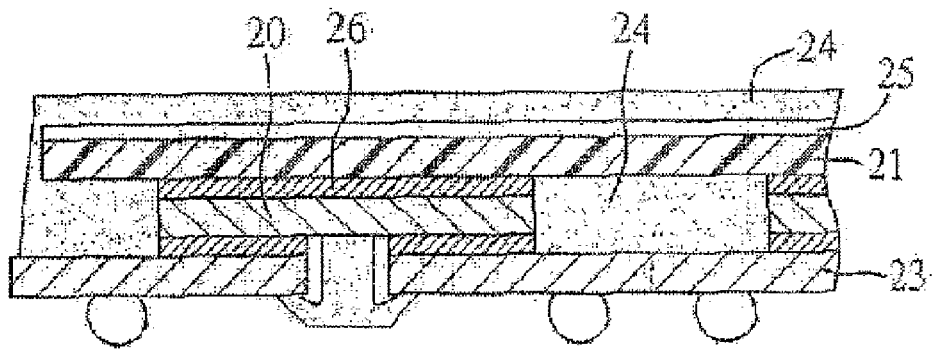
FIGS. 2A to 2C (PRIOR ART) are cross-sectional views of steps of a method for fabricating a semiconductor package disclosed in U.S. Pat. No. 6,458,626.
Figure 2B:
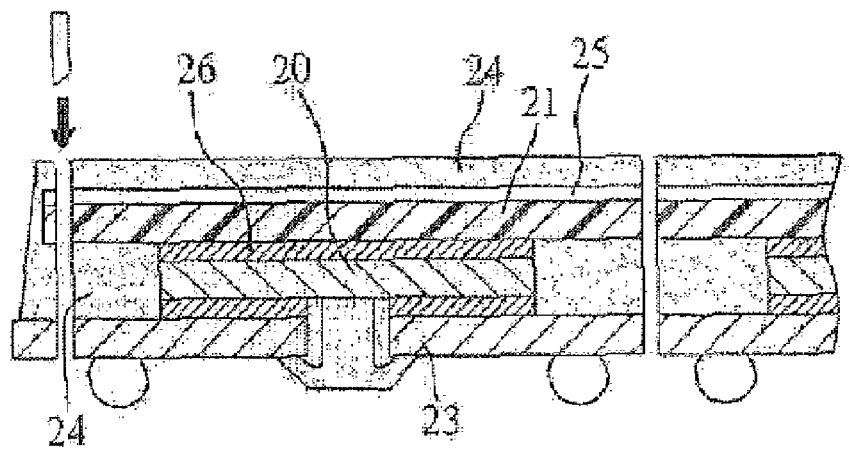
Figure 2C:
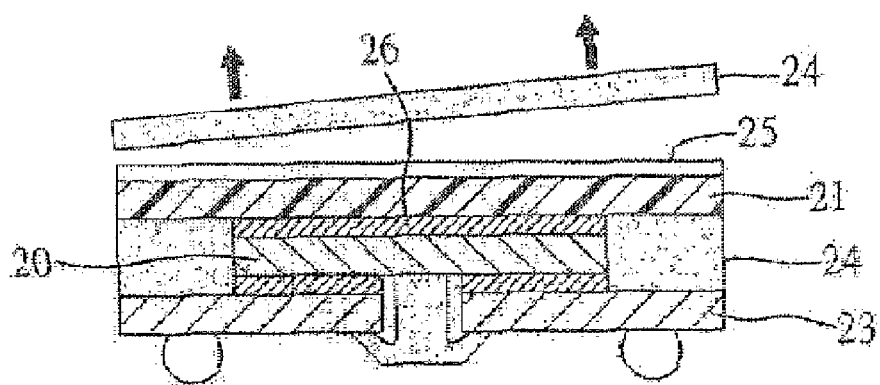
Figure 3:
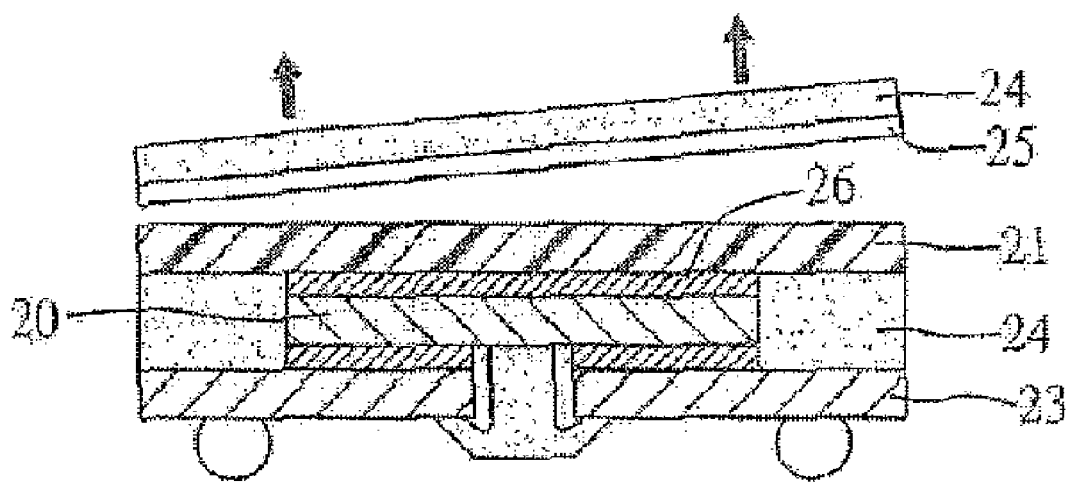
FIG. 3 (PRIOR ART) is a cross-sectional view of a semiconductor package disclosed in U.S. Pat. No. 6,444,498.
Figure 4A:
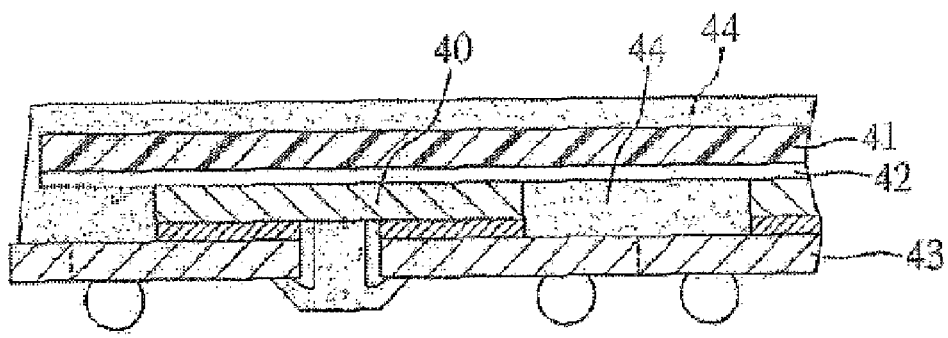
FIGS. 4A to 4C (PRIOR ART) are cross-sectional views of steps of a method for fabricating a semiconductor package disclosed in U.S. Pat. No. 6,699,731.
Figure 4B:
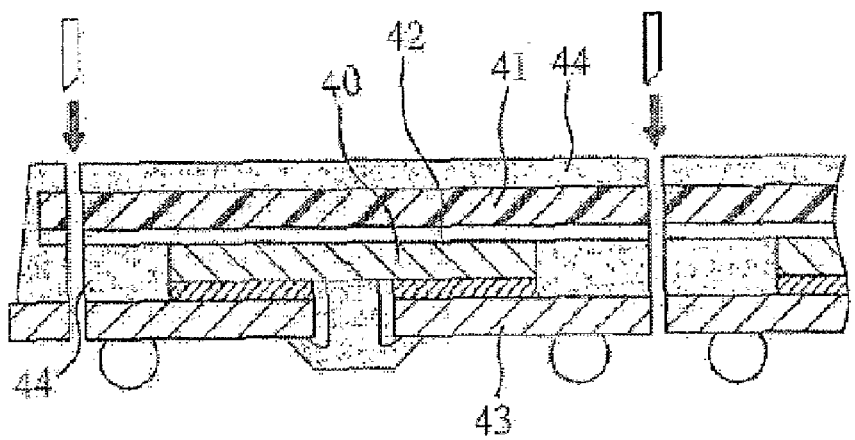
Figure 4C:
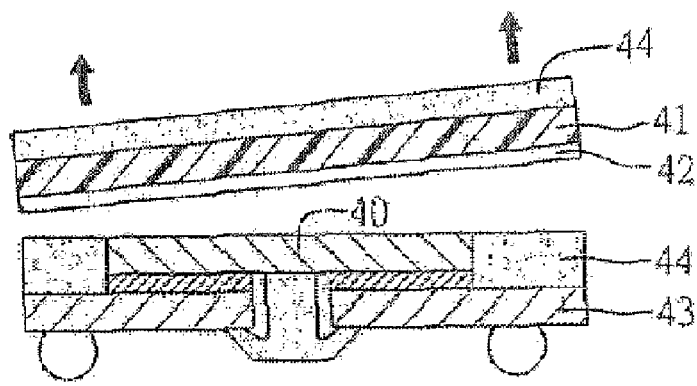
Figure 5A:
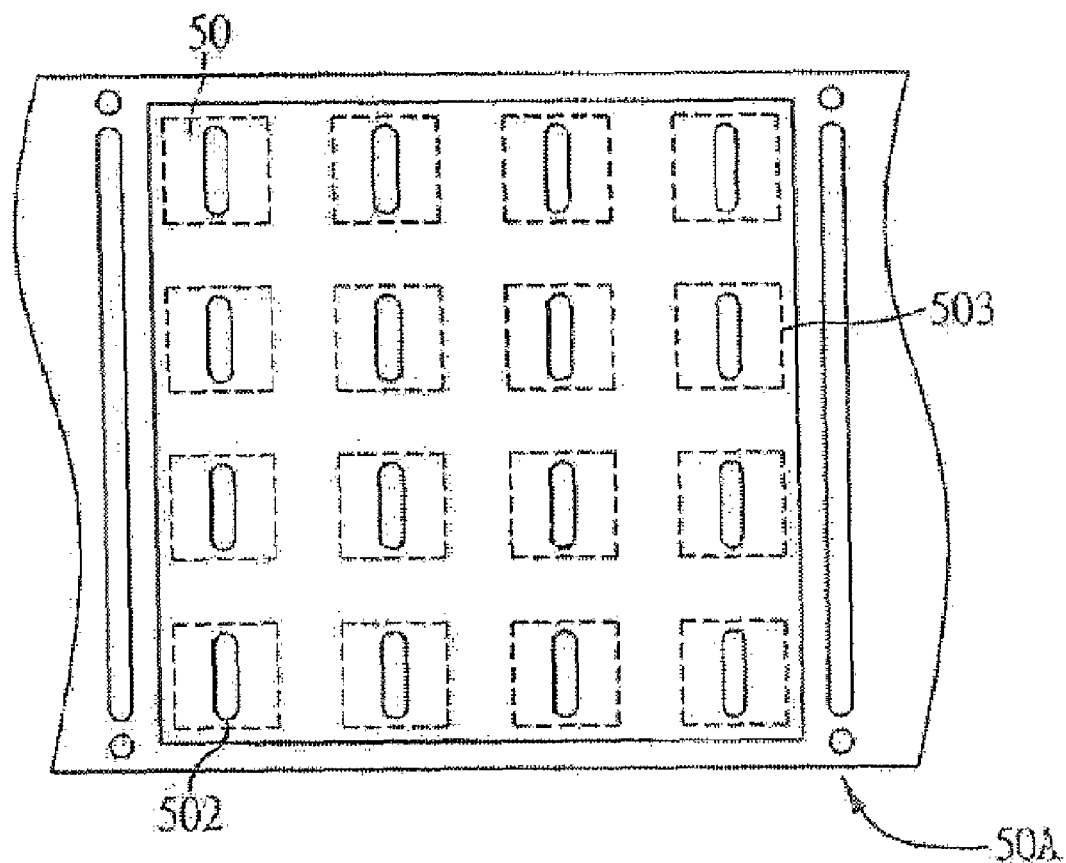
FIGS. 5A to 5G are cross-sectional views of steps of a method for fabricating a heat dissipating package structure according to a first preferred embodiment of the present invention.

As shown in FIG. 5A, a matrix-type chip carrier module plate such as a matrix-type substrate module plate 50A is provided, which comprises a plurality of array-arranged substrates 50, wherein each of the substrates 50 has an upper surface 500, a lower surface 501, and an opening 502 penetrating therethrough. It should be noted that besides being array-arranged, the substrates 50 can also be arranged in a strip, or single substrates can be employed under appropriate fabrication conditions.

Figure 5B:
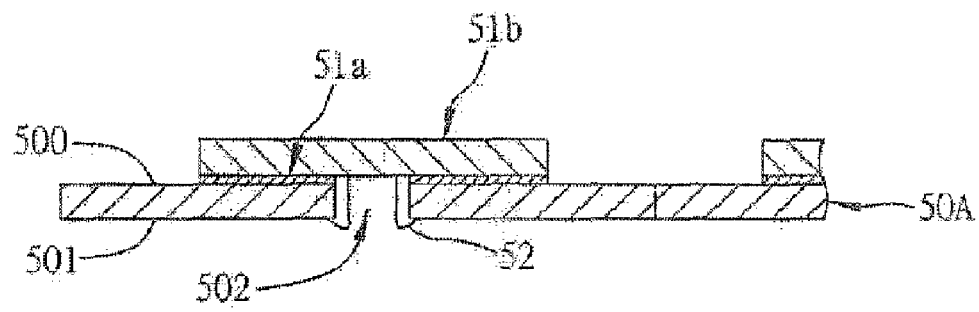

As shown in FIG. 5B, an active surface 51a of a semiconductor chip 51 is mounted at a predetermined position on the upper surface 500 of each of the substrates 50 via an adhesive layer 55 such as silver paste, allowing the chip 51 to seal one end of the opening 502 of each of the substrates 50. A plurality of bonding wires 52 are formed through the opening 502 to be bonded to the active surface 51a of the chip 51 and the lower surface 501 of each of the substrates 50 respectively, such that the chip 51 is electrically connected to each of the substrates 50 by the bonding wires 52. The wire-bonding process is conventional and not to be further described herein.

Figure 5C:
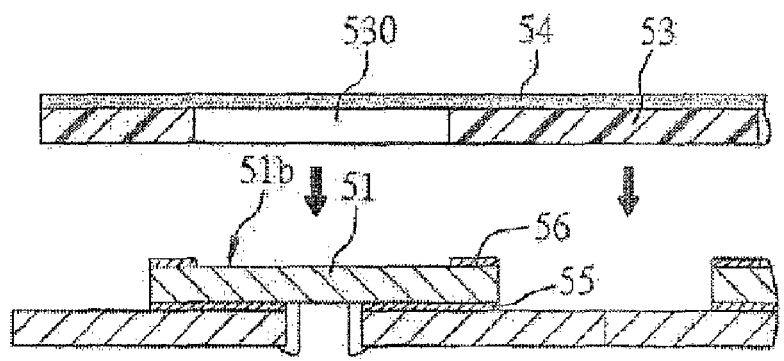

As shown in FIG. 5C, a heat spreader 53 having a hollow structure 530 is attached to an interface layer 54 such as a tape. In this embodiment, the hollow structure 530 of the heat spreader 53 corresponds in position to a central portion of the chip 51, and the hollow structure 530 of the heat spreader 53 is smaller in size than the chip 51, such that the heat spreader 53 with the interface layer 54 is mounted on a peripheral portion of a non-active surface 51b of the chip 51 via a thermally conductive adhesive layer 56. This allows the central portion of the non-active surface 51b of the chip 51 to be subsequently exposed to the hollow structure 530 to thereby reduce thermal resistance from the adhesive layer 56 between the chip 51 and the heat spreader 53, and allows the chip 51 to directly come into contact with the atmosphere to improve the heat dissipating efficiency.

The heat spreader 53 has a size sufficient to completely cover the substrates 50 mounted with the chips 51. In other words, peripheral edges of the heat spreader 53 must be extended out of sides 503 (as indicated by dotted lines shown in FIG. 5A) of the substrates 50. The heat spreader 53 can be made of a metallic material such as copper, aluminum, copper alloy or aluminum alloy, etc. The hollow structure 530 of the heat spreader 53 can have a flexible shape, and the heat spreader 53 is not limited to having only one hollow structure.

The interface layer 54 can be made of a polyimide (P.I.) tape, a metallic material film (such as copper, aluminum), a highly thermal resistant organic material film (such as FR4, BT), or a highly thermal resistant paper film. Adhesion between the interface layer 54 and an encapsulant for encapsulating the chips 51 is larger than that between the interface layer 54 and the heat spreader 53, and the adhesion between the interface layer 54 and the heat spreader 53 is smaller than that between the heat spreader 53 and the encapsulant.

Figure 5D:
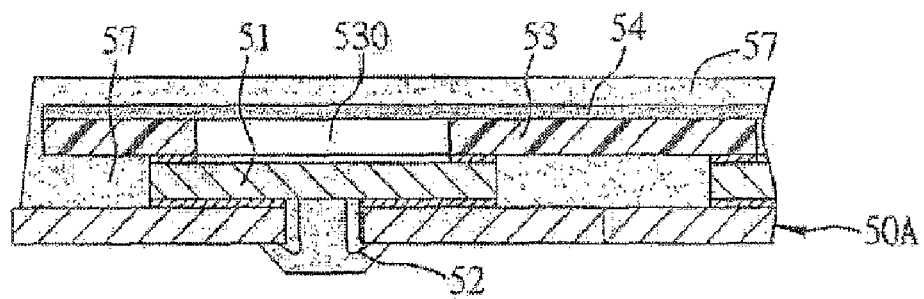

As shown in FIG. 5D, a combined structure of the heat spreader 53 with the interface layer 54, the chips 51 and the substrate module plate 50A is placed in a mold cavity of an encapsulation mold (not shown) to perform a molding process, such that an encapsulant 57 is formed for encapsulating the heat spreader 53 with the interface layer 54, the chips 51 and the bonding wires 52. Since the combined structure has a height allowing a suitable distance to be formed between the interface layer 54 on the heat spreader 53 and a top wall of the mold cavity, the chips 51 would not suffer pressure from the encapsulation mold or the heat spreader 53 after engagement of the encapsulation mold in the molding process, such that chip cracking is avoided and there is no need to have accurate control in height for attaching the heat spreader 53 to the chips 51, thereby effectively improving the yields and reliability of fabricated products.

Figure 5E:
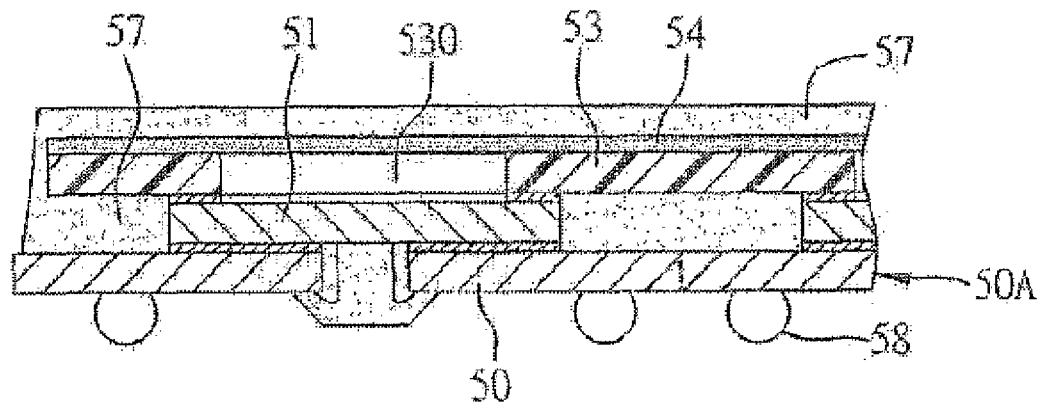

As shown in FIG. 5E, a plurality of conductive elements such as solder balls 58 are implanted on the lower surface 501 of each of the substrates 50 of the substrate module plate 50A, to allow the chips 51 to be electrically connected to an external device via the solder balls 58. Such ball-implanting process is conventional and not to be further described herein. Alternatively, the solder balls 58 can be implanted after completing a subsequent singulation process for the substrates.

Figure 5F:
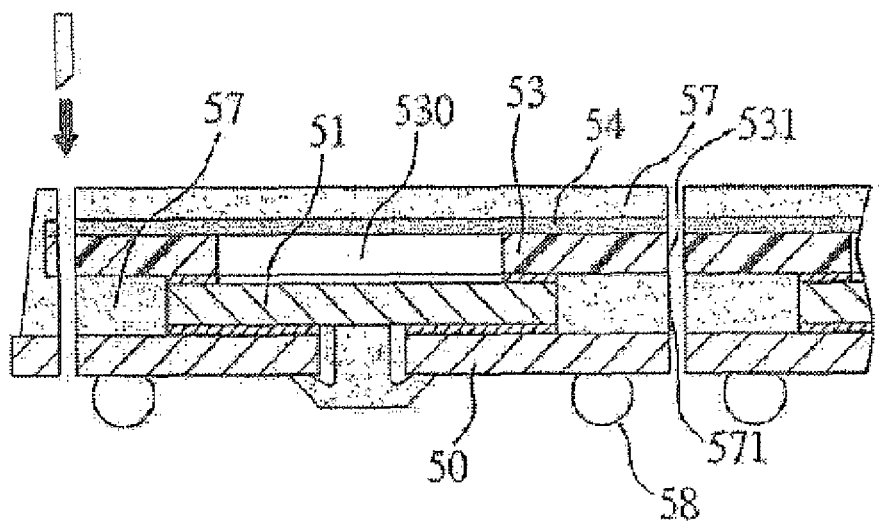

As shown in FIG. 5F, a singulation process is performed using a jig (not shown).

The singulation process is to remove peripheral non-electrical functional portions of package units after completing the molding process to form the individual package units and allow sides 531 of the heat spreader 53 to be exposed from the encapsulant 57 and flush with sides 571 of the encapsulant 57, such that no flash occurs on the sides 531 of the heat spreader 53. This also makes the heat spreader 53 have the same area as that of the substrate 50, without a need to precisely size the heat spreader to correspond to a size of the mold cavity. The heat spreader 53 and the chip 51 are attached to each other in a batch-type manner, thereby simplifying the fabrication processes and reducing the fabrication time and costs.

Figure 5G:
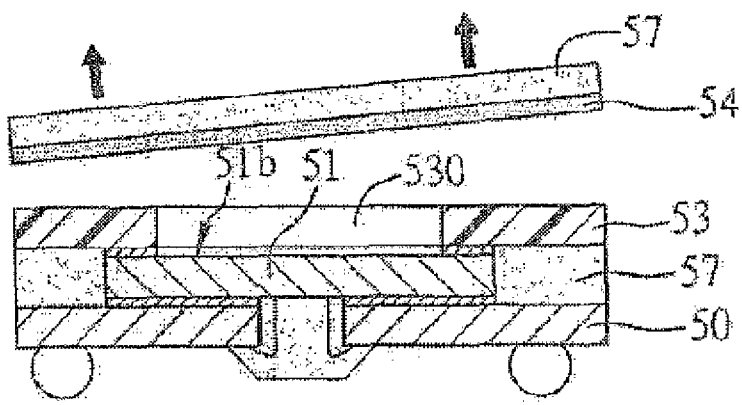

As shown in FIG. 5G, after completing the singulation process, the interface layer 54 and a part of the encapsulant 57 formed on the interface layer 54 are removed. As the adhesion between the interface layer 54 and the heat spreader 53 is smaller than that between the interface layer 54 and the encapsulant 57, the interface layer 54 can be removed from the heat spreader 53 together with removal of the encapsulant 57 formed on the interface layer 54. Further, as the adhesion between the heat spreader 53 and the encapsulant 57 is larger than that between the interface layer 54 and the heat spreader 53, during removing the interface layer 54 from the heat spreader 53, the bonding between the heat spreader 53 and the encapsulant 57 is not affected and no residue of the interface layer 54 is left on the heat spreader 53 and the encapsulant 57. Consequently, the heat spreader 53 is exposed from the encapsulant 57 and directly in contact with the atmosphere, and the non-active surface 51b of the chip 51 is partly exposed to the hollow structure 530 of the heat spreader 53, thereby reducing thermal resistance from the adhesive layer between the chip 51 and the heat spreader 53, and allowing the chip 51 to directly come into contact with the atmosphere to improve the heat dissipating efficiency. Further, there is no need to perform any post treatment for deflashing and residue removal, such that the packaging costs are reduced and appearance of the fabricated semiconductor package structure is assured.

Figure 6A:
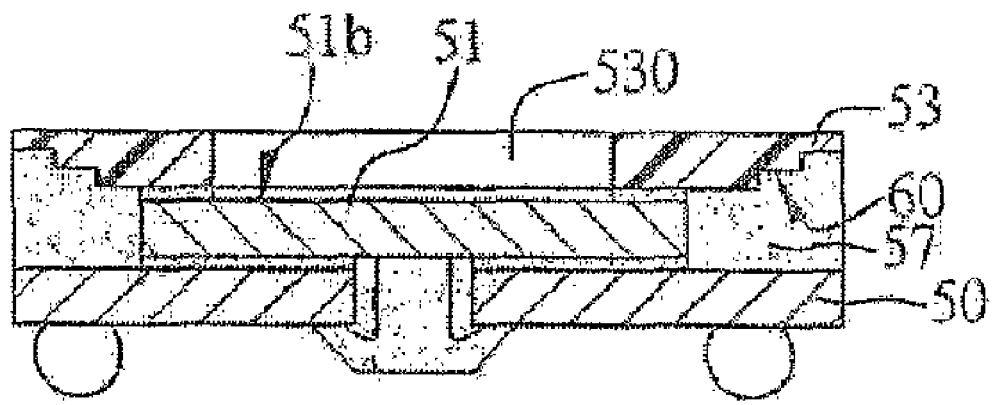
FIG. 6A is a cross-sectional view showing the heat dissipating package structure with enhanced bonding between a heat spreader and an encapsulant according to the first preferred embodiment of the present invention.
Figure 6B:
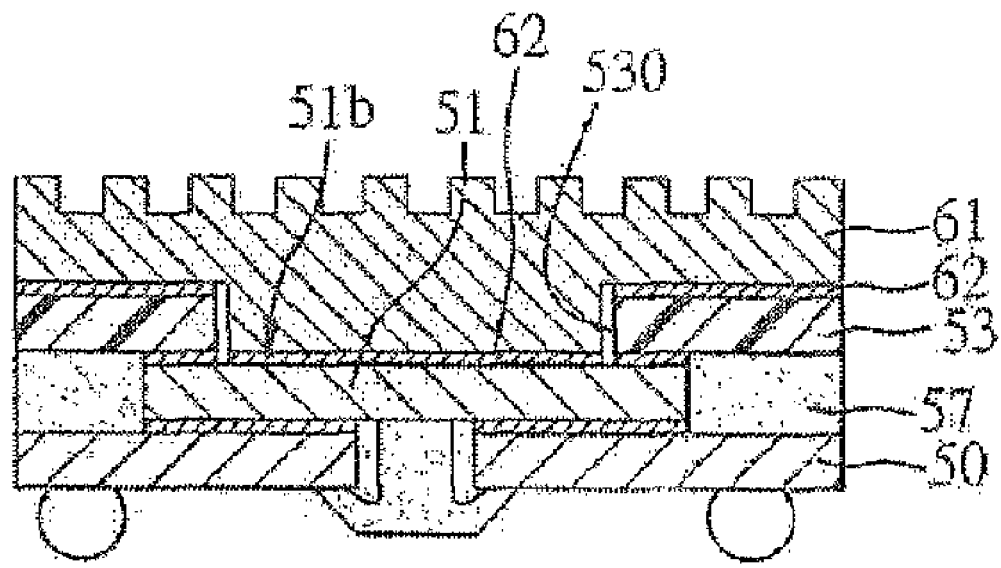
FIG. 6B is a cross-sectional view showing a heat-dissipating structure being provided on the heat spreader in the heat dissipating package structure according to the first preferred embodiment of the present invention.

Moreover, as shown in FIG. 6A, in order to enhance the bonding between the heat spreader 53 and the encapsulant 57, a surface 60 of the heat spreader 53 in contact with the encapsulant 57 can be made uneven and/or subjected to a black oxidation treatment. Further, a heat-dissipating structure 61 (as shown in FIG. 6B) can be mounted on the heat spreader 53 via a thermally conductive adhesive layer 62, allowing the heat-dissipating structure 61 to be extended to and come into contact with the part of the non-active surface 51b of the chip 51 exposed to the hollow structure 530 of the heat spreader 53, such that heat produced by operation of the chip 51 can be dissipated through the heat-dissipating structure 61.

Second Preferred Embodiment

FIGS. 7A-7G show steps of a method for fabricating a heat dissipating package structure according to a second preferred embodiment of the present invention. The fabrication method of the second embodiment is substantially the same as that of the first embodiment, with a primary difference in that the semiconductor chip is mounted and electrically connected to the substrate in a flip-chip manner in the second embodiment.

Figure 7A:
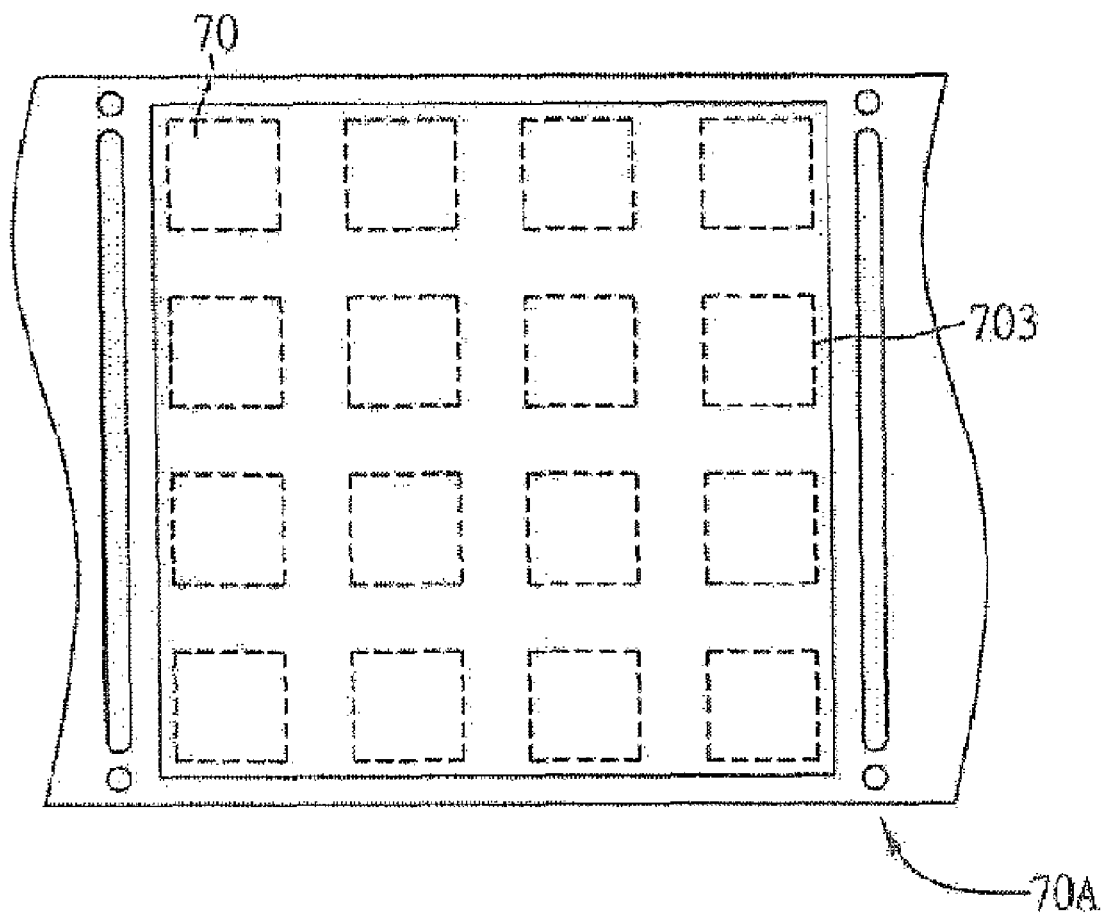
FIGS. 7A to 7G are cross-sectional views of steps of a method for fabricating a heat dissipating package structure according to a second preferred embodiment of the present invention.

As shown in FIG. 7A, a matrix-type substrate module plate 70A is provided, which comprises a plurality of array-arranged substrates 70, wherein each of the substrates 70 has an upper surface 700 and a lower surface 701. It should be noted that besides being array-arranged, the substrates 70 can also be arranged in a strip, or single substrates can be employed under appropriate fabrication conditions.

Figure 7B:
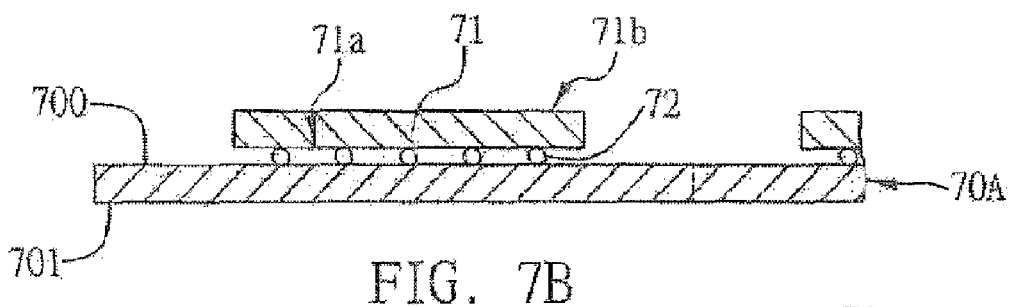

As shown in FIG. 7B, an active surface 71a of a semiconductor chip 71 is mounted at a predetermined position on the upper surface 700 of each of the substrates 70 and electrically connected to each of the substrates 70 via conductive bumps 72 in a flip-chip manner. A flip-chip underfilling process may further be performed to fill an underfill material (not shown) between the flip chips 71 and the substrates 70; the flip-chip underfilling process is conventional and not to be further described herein.

Figure 7C:
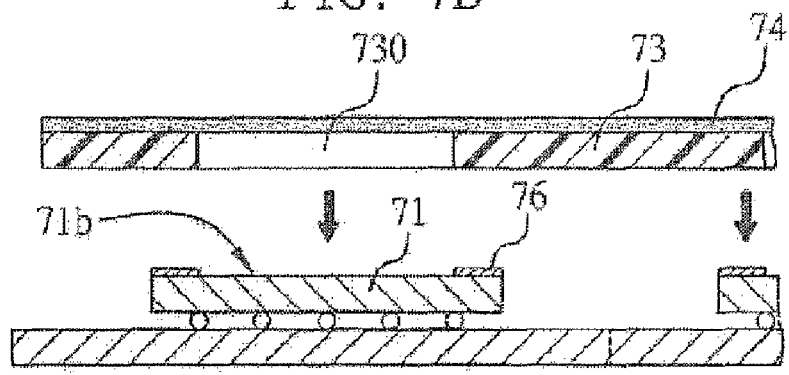

As shown in FIG. 7C, a heat spreader 73 having a hollow structure 730 is attached to an interface layer 74 such as a tape. In this embodiment, the hollow structure 730 of the heat spreader 73 corresponds in position to a central portion of the chip 71, and the hollow structure 730 of the heat spreader 73 is smaller in size than the chip 71, such that the heat spreader 73 with the interface layer 74 is mounted on a peripheral portion of a non-active surface 71b of the chip 71 via a thermally conductive adhesive layer 76. This allows the central portion of the non-active surface 71b of the chip 71 to be subsequently exposed to the hollow structure 730 to thereby reduce thermal resistance from the adhesive layer 76 between the chip 71 and heat spreader 73, and allows the chip 71 to directly come into contact with the atmosphere to improve the heat dissipating efficiency.

The heat spreader 73 has a size sufficient to completely cover the substrates 70 mounted with the chips 71. In other words, peripheral edges of the heat spreader 73 must be extended out of sides 703 (as indicated by dotted lines shown in FIG. 7A) of the substrates 70. The heat spreader 73 can be made of a metallic material such as copper, aluminum, copper alloy or aluminum alloy, etc. The hollow structure 730 of the heat spreader 73 can have a flexible shape, and the heat spreader 73 is not limited to having only one hollow structure.

The interface layer 74 can be made of a P.I. tape, a metallic material film (such as copper, aluminum), a highly thermal resistant organic material film (such as FR4, BT), or a highly thermal resistant paper film.

Figure 7D:
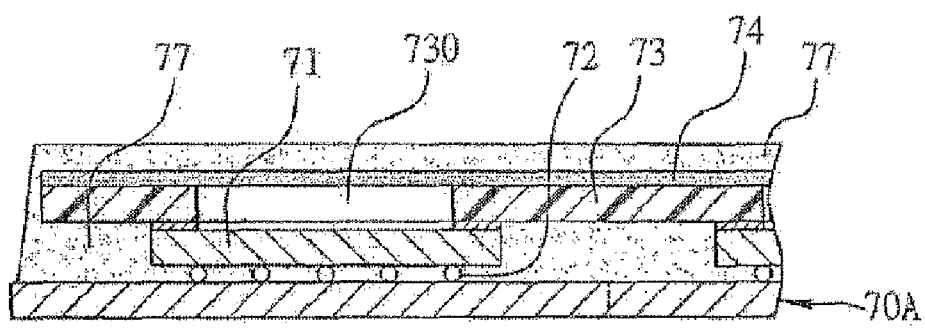

As shown in FIG. 7D, a combined structure of the heat spreader 73 with the interface layer 74, the chips 71 and the substrate module plate 70A is placed in a mold cavity of an encapsulation mold (not shown) to perform a molding process, such that an encapsulant 77 is formed for encapsulating the heat spreader 73 with the interface layer 74, the chips 71 and the conductive bumps 72. Since the combined structure has a height allowing a suitable distance to be formed between the interface layer 74 on the heat spreader 73 and a top wall of the mold cavity, the chips 71 would not suffer pressure from the encapsulation mold or the heat spreader 73 after engagement of the encapsulation mold in the molding process, such that chip cracking is avoided and there is no need to have accurate control in height for attaching the heat spreader 73 to the chips 71, thereby effectively improving the yields and reliability of fabricated products.

Figure 7E:
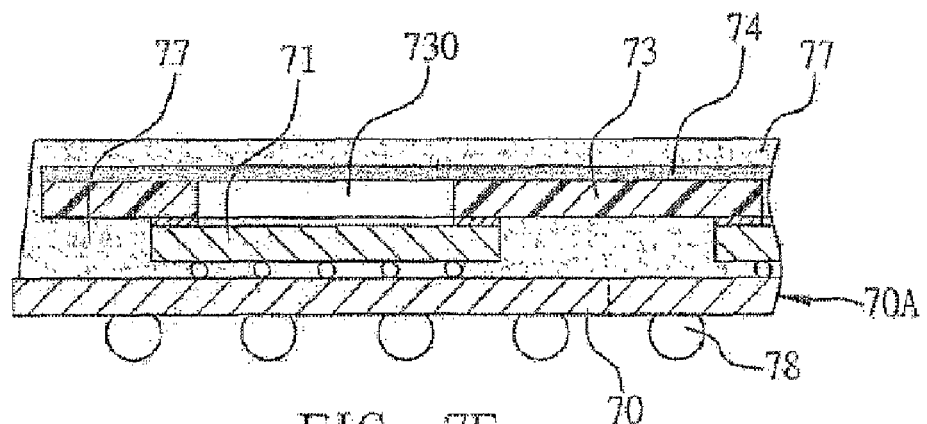

As shown in FIG. 7E, a plurality of solder balls 78 are implanted on the lower surface 701 of each of the substrates 70 of the substrate module plate 70A, to allow the chips 71 to be electrically connected to an external device via the solder balls 78. Such ball-implanting process is conventional and not to be further described herein. Alternatively, the solder balls 78 can be implanted after completing a subsequent singulation process for the substrates.

Figure 7F:
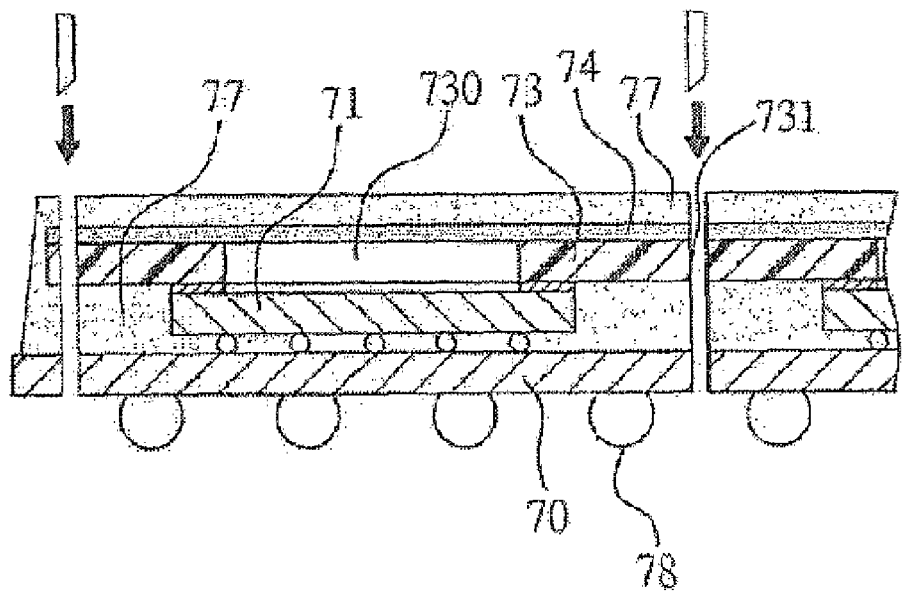

As shown in FIG. 7F, a singulation process is performed using a jig (not shown).

After singulation, sides 731 of the heat spreader 73 are exposed from the encapsulant 77 and flush with sides 771 of the encapsulant 77, such that no flash occurs on the sides 731 of the heat spreader 73. This makes the heat spreader 73 have the same area as that of the substrate 70, without a need to precisely size the heat spreader to correspond to a size of the mold cavity. Further, the heat spreader 73 and the chip 71 are attached to each other in a batch-type manner, thereby simplifying the fabrication processes and reducing the fabrication time and costs.

Figure 7G:
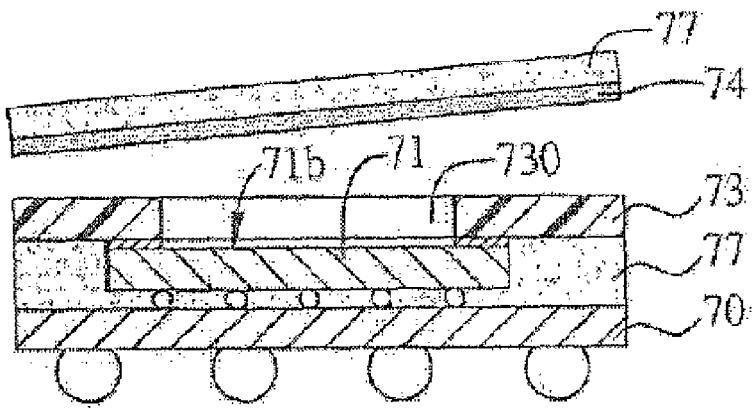

As shown in FIG. 7G, after completing the singulation process, the interface layer 74 and a part of the encapsulant 77 formed on the interface layer 74 are removed. As the adhesion between the interface layer 74 and the heat spreader 73 is smaller than that between the interface layer 74 and the encapsulant 77, the interface layer 74 can be removed from the heat spreader 73 together with removal of the encapsulant 77 formed on the interface layer 74. Further, as the adhesion between the heat spreader 73 and the encapsulant 77 is larger than that between the interface layer 74 and the heat spreader 73, when the interface layer 74 is removed from the heat spreader 73, the bonding between the heat spreader 73 and the encapsulant 77 is not affected and no residue of the interface layer 74 is left on the heat spreader 73 and the encapsulant 77. Consequently, the heat spreader 73 is exposed from the encapsulant 77 and directly in contact with the atmosphere, and the non-active surface 71b of the chip 71 is partly exposed to the hollow structure 730 of the heat spreader 73, thereby reducing thermal resistance from the adhesive layer between the chip 71 and the heat spreader 73, and allowing the chip 71 to directly come into contact with the atmosphere to improve the heat dissipating efficiency. Moreover, there is no need to perform any post treatment for deflashing and residue removal, such that the packaging costs are reduced and appearance of the fabricated semiconductor package structure is assured.

Figure 8A:
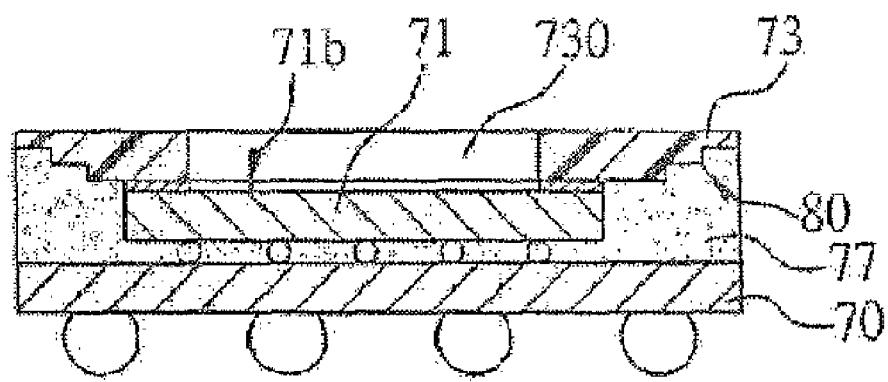
FIG. 8A is a cross-sectional view showing the heat dissipating package structure with enhanced bonding between a heat spreader and an encapsulant according to the second preferred embodiment of the present invention.
Figure 8B:
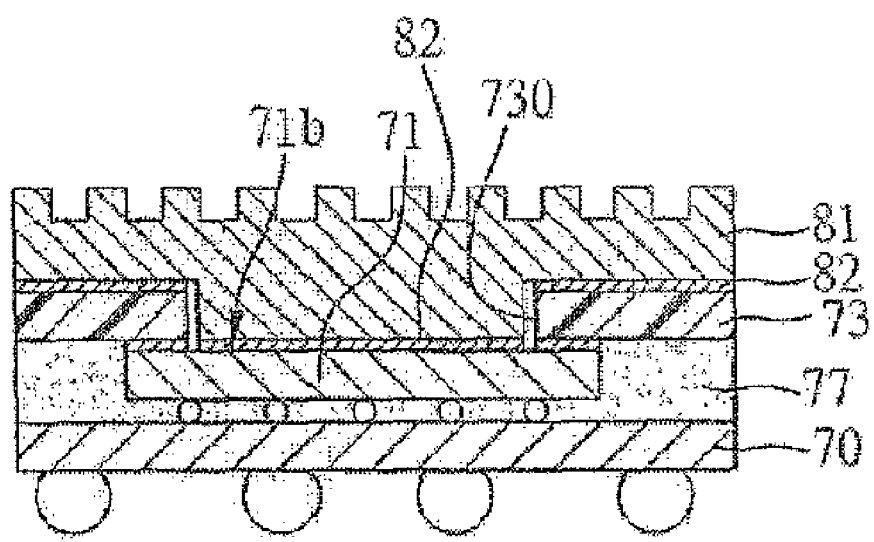
FIG. 8B is a cross-sectional view showing a heat-dissipating structure being provided on the heat spreader in the heat dissipating package structure according to the second preferred embodiment of the present invention.

Further, as shown in FIG. 8A, in order to enhance the bonding between the heat spreader 73 and the encapsulant 77, a surface 80 of the heat spreader 73 in contact with the encapsulant 77 can be made uneven and/or subjected to a black oxidation treatment. Moreover, a heat-dissipating structure 81 (as shown in FIG. 8B) can be mounted on the heat spreader 73 via a thermally conductive adhesive layer 82, allowing the heat-dissipating structure 81 to be extended to and come into contact with the part of the non-active surface 71b of the chip 71 exposed to the hollow structure 730 of the heat spreader 73, such that heat produced by operation of the chip 71 can be dissipated through the heat-dissipating structure 81.

Third Preferred Embodiment

Figure 9A:
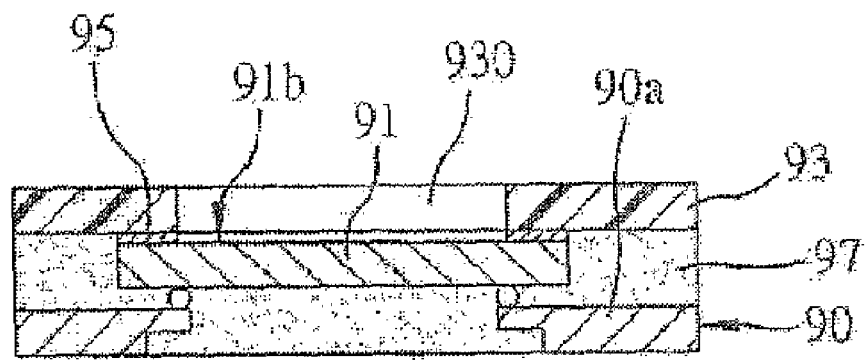
FIGS. 9A and 9B are schematic diagrams of a heat dissipating package structure according to a third preferred embodiment of the present invention.

FIG. 9A is a cross-sectional view of a heat dissipating package structure according to a third preferred embodiment of the present invention. This heat dissipating package structure is similar to the semiconductor package structures fabricated by the methods in the first and second embodiments, with differences in that in the third embodiment, a QFN lead frame 90 is used as a chip carrier for accommodating a semiconductor chip 91, and the chip 91 is mounted and electrically connected to leads 90a of the QFN lead frame 90 in a flip-chip manner, such that the chip 91 can subsequently be electrically connected to an external device via the leads 90a. A heat spreader 93 having a hollow structure 930 is mounted on a non-active surface 91b of the chip 91 via a thermally conductive adhesive layer 95, wherein the chip 91 is larger in size than the hollow structure 930, such that the non-active surface 91b of the chip 91 is partly exposed to the hollow structure 930 of the heat spreader 93. An encapsulant 97 for encapsulating the chip 91 is formed between the heat spreader 93 and the QFN lead frame 90, wherein bottom surfaces and sides of the leads 90a are exposed from the encapsulant 97, and sides of the heat spreader 93 are exposed from the encapsulant 97 and flush with sides of the encapsulant 97.

Figure 9B:
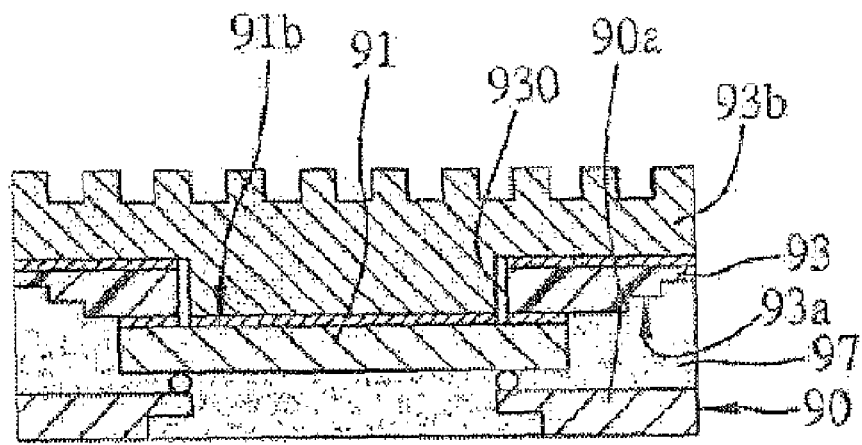

Further, as shown in FIG. 9B, a surface 93a of the heat spreader 93 in contact with the encapsulant 97 can be made uneven and/or subjected to a black oxidation treatment so as to enhance the bonding between the heat spreader 93 and the encapsulant 97. Moreover, a heat-dissipating structure 93b can be mounted on the heat spreader 93 via a thermally conductive adhesive layer, allowing the heat-dissipating structure 93b to be extended to and come into contact with the part of the non-active surface 91b of the chip 91 exposed to the hollow structure 930 of the heat spreader 93, such that heat produced by operation of the chip 91 can be dissipated through the heat-dissipating structure 93b.

Fourth Preferred Embodiment

Figure 10A:
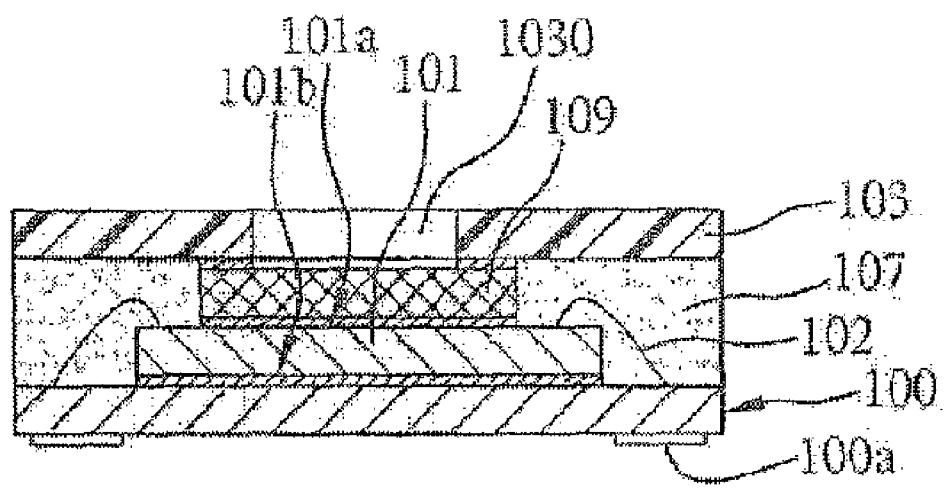
FIGS. 10A and 10B are schematic diagrams of a heat dissipating package structure according to a fourth preferred embodiment of the present invention.

FIG. 10A is a cross-sectional view of a heat dissipating package structure according to a fourth preferred embodiment of the present invention. This heat dissipating package structure is similar to the semiconductor package structures fabricated by the methods in the first and second embodiments, with differences in that in the fourth embodiment, a LGA substrate 100 is used as a chip carrier for accommodating a semiconductor chip 101, and the chip 101 is mounted via its non-active surface 101b on the LGA substrate 100 and is electrically connected to the LGA substrate 100 by bonding wires 102, wherein a plurality of metallic contacts 100a are formed on a bottom surface of the LGA substrate 100 to electrically connect the chip 101 to an external device. A buffer pad 109 having a similar CTE to that of the chip 101 is mounted on an active surface 101a of the chip 101 at a position not interfering with the bonding wires 102, and a heat spreader 103 having a hollow structure 1030 is mounted on the buffer pad 109, wherein the buffer pad 109 is larger in size than the hollow structure 1030, such that the buffer pad 109 is partly exposed to the hollow structure 1030 of the heat spreader 103. An encapsulant 107 for encapsulating the chip 101 is formed between the heat spreader 103 and the LGA substrate 100, wherein sides of the heat spreader 103 are exposed from the encapsulant 107 and flush with sides of the encapsulant 107. As the buffer pad 109 is made not interfering with the bonding wires 102, a thickness of the buffer pad 109 should be slightly larger than a height of top of loops of the bonding wires 102, such that the heat spreader 103 when being mounted on the buffer pad 109 does not come into contact with the bonding wires 102. The buffer pad 109 can release thermal stress generated from the heat spreader 103 to the chip 101 under a high temperature due to mismatch in CTE between the heat spreader 103 and the chip 101, thereby preventing the chip 101 from cracking by pressure. Such arrangement still allows heat produced by the chip 101 to be transmitted to the heat spreader 103 via the buffer pad 109 or directly to the part of the buffer pad 109 exposed to the hollow structure 1030 of the heat spreader 103 so as to dissipate the heat to the atmosphere.

Figure 10B:
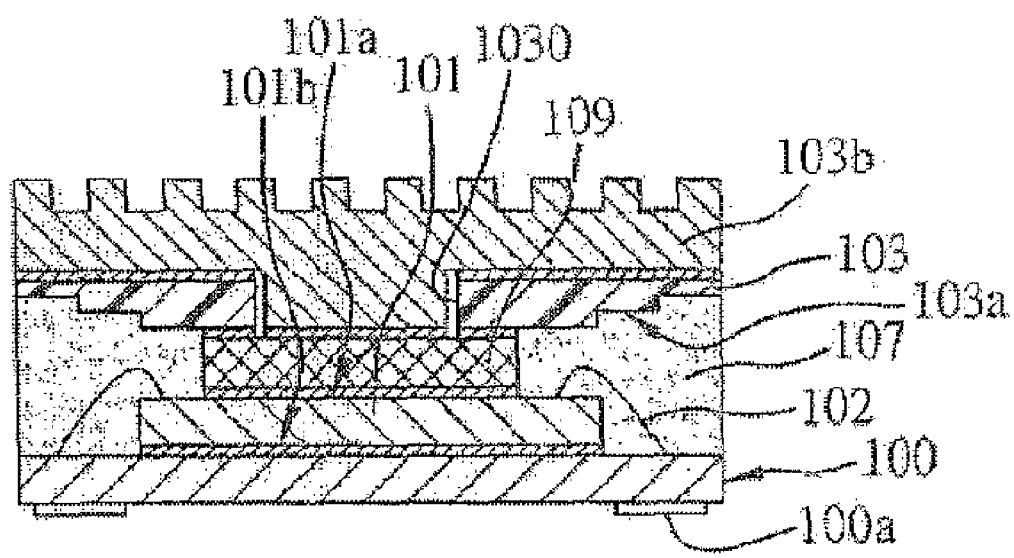

Further, as shown in FIG. 10B, a surface 103a of the heat spreader 103 in contact with the encapsulant 107 can be made uneven and/or subjected to a black oxidation treatment so as to enhance the bonding between the heat spreader 103 and the encapsulant 107. Moreover, a heat-dissipating structure 103b can be mounted on the heat spreader 103 via a thermally conductive adhesive layer, allowing the heat-dissipating structure 103b to be extended to and come into contact with the part of the buffer pad 109 exposed to the hollow structure 1030, such that heat produced by operation of the chip 101 can be dissipated through the heat-dissipating structure 103b. The buffer pad 109 can be made of a dummy die, or a metallic material such as copper, aluminum, etc. if appropriate.

Fifth Preferred Embodiment

Figure 11A:
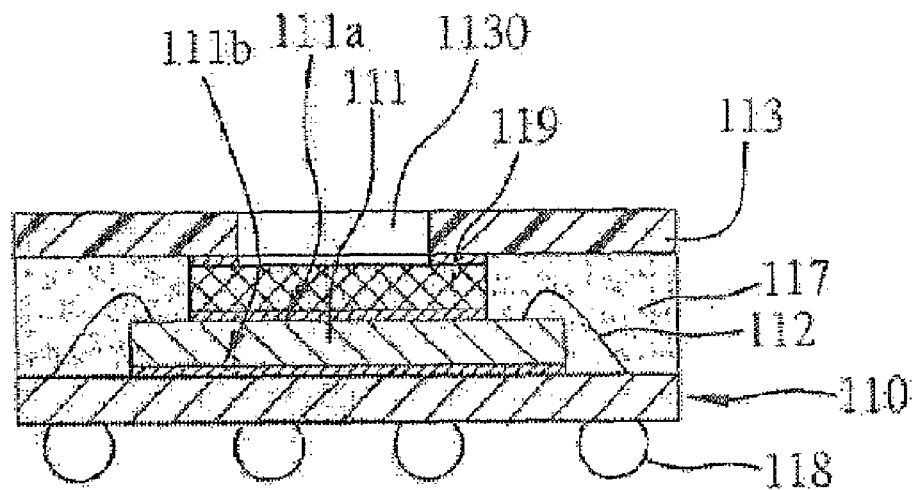
FIGS. 11A and 11B are schematic diagrams of a heat dissipating package structure according to a fifth preferred embodiment of the present invention.

FIG. 11A is a cross-sectional view of a heat dissipating package structure according to a fifth preferred embodiment of the present invention. This heat dissipating package structure is similar to the semiconductor package structures fabricated by the methods in the first and second embodiments, with differences in that in the fifth embodiment, a BGA substrate 110 is used as a chip carrier for accommodating a semiconductor chip 111, and the chip 111 is mounted via its non-active surface 111b on the BGA substrate 110 and is electrically connected to the BGA substrate 110 by bonding wires 112. A plurality of solder balls 118 are formed on a bottom surface of the BGA substrate 110 to subsequently electrically connect the chip 111 to an external device. A buffer pad 119 having a similar CTE to that of the chip 111 is mounted on an active surface 111a of the chip 111 at a position not interfering with the bonding wires 112, and a heat spreader 113 having a hollow structure 1130 is mounted on the buffer pad 119, wherein the buffer pad 119 is larger in size than the hollow structure 1130, such that the buffer pad 119 is partly exposed to the hollow structure 1130. An encapsulant 117 for encapsulating the chip 111 is formed between the heat spreader 113 and the BGA substrate 110, wherein sides of the heat spreader 113 are exposed from the encapsulant 117 and flush with sides of the encapsulant 117. As the buffer pad 119 is made not interfering with the bonding wires 112, a thickness of the buffer pad 119 should be slightly larger than a height of top of loops of the bonding wires 112, such that the heat spreader 113 when being mounted on the buffer pad 119 does not come into contact with the bonding wires 112. The buffer pad 119 can release thermal stress generated from the heat spreader 113 to the chip 111 under a high temperature due to mismatch in CTE between the heat spreader 113 and the chip 111, thereby preventing the chip 111 from cracking by pressure. Such arrangement still allows heat produced by the chip 111 to be transmitted to the heat spreader 113 via the buffer pad 119 or directly to the part of the buffer pad 119 exposed to the hollow structure 1130 of the heat spreader 113 so as to dissipate the heat to the atmosphere.

Figure 11B:
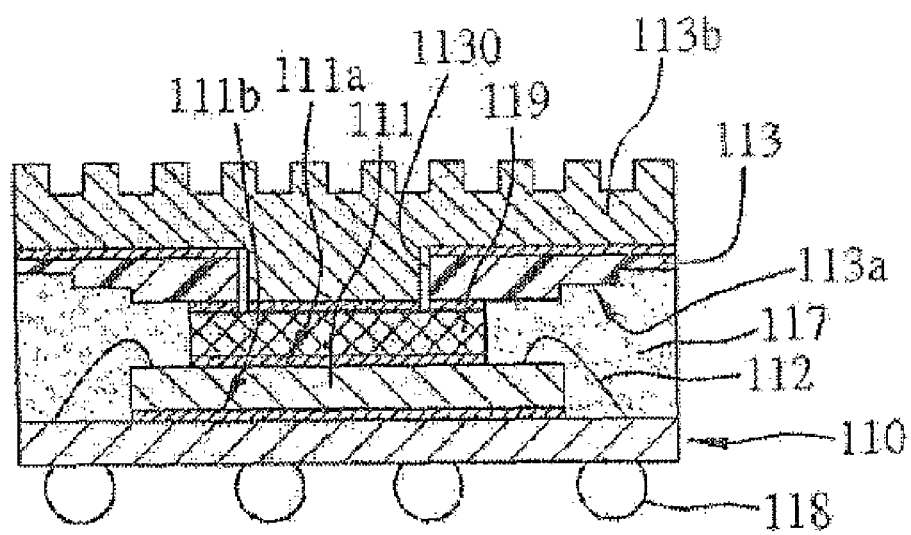

Further, as shown in FIG. 11B, a surface 113a of the heat spreader 113 in contact with the encapsulant 117 can be made uneven and/or subjected to a black oxidation treatment so as to enhance the bonding between the heat spreader 113 and the encapsulant 117. Moreover, a heat-dissipating structure 113b can be mounted on the heat spreader 113 via a thermally conductive adhesive layer, allowing the heat-dissipating structure 113b to be extended to and come into contact with the part of the buffer pad 119 exposed to the hollow structure 1130 of the heat spreader 113 such that heat produced by operation of the chip 111 can be dissipated through the heat-dissipating structure 113b.

Sixth Preferred Embodiment

Figure 12A:
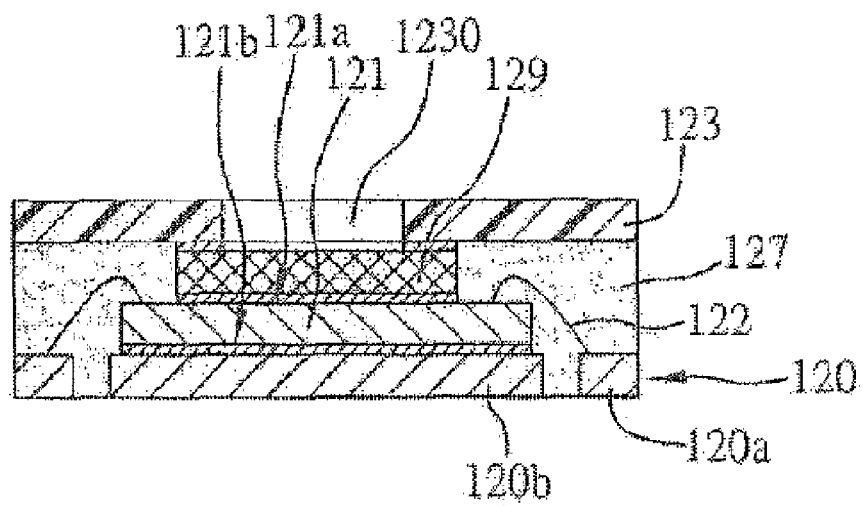
FIGS. 12A and 12B are schematic diagrams of a heat dissipating package structure according to a sixth preferred embodiment of the present invention.

FIG. 12A is a cross-sectional view of a heat dissipating package structure according to a sixth preferred embodiment of the present invention. This heat dissipating package structure is similar to the semiconductor package structures fabricated by the methods in the first and second embodiments, with differences in that in the sixth embodiment, a QFN lead frame 120 is used as a chip carrier for accommodating a semiconductor chip 121, and the chip 121 is mounted via its non-active surface 121b on a die pad 120b of the QFN lead frame 120 and is electrically connected to leads 120a of the QFN lead frame 120 by bonding wires 122, such that the chip 121 can subsequently be electrically connected to an external device via the leads 120a. A buffer pad 129 having a similar CTE to that of the chip 121 is mounted on an active surface 121a of the chip 121 at a position not interfering with the bonding wires 122, and a heat spreader 123 having a hollow structure 1230 is mounted on the buffer pad 129, wherein the buffer pad 129 is larger in size than the hollow structure 1230, such that the buffer pad 129 is partly exposed to the hollow structure 1230. An encapsulant 127 for encapsulating the chip 121 is formed between the heat spreader 123 and the QFN lead frame 120, wherein sides of the heat spreader 123 are exposed from the encapsulant 127 and flush with sides of the encapsulant 127. As the buffer pad 129 is made not interfering with the bonding wires 122, a thickness of the buffer pad 129 should be slightly larger than a height of top of loops of the bonding wires 122, such that the heat spreader 123 when being mounted on the buffer pad 129 does not come into contact with the bonding wires 122. The buffer pad 129 can release thermal stress generated from the heat spreader 123 to the chip 121 under a high temperature due to mismatch in CTE between the heat spreader 123 and the chip 121, thereby preventing the chip 121 from cracking by pressure. Such arrangement still allows heat produced by the chip 121 to be transmitted to the heat spreader 123 via the buffer pad 129 or directly to the part of the buffer pad 129 exposed to the hollow structure 1230 of the heat spreader 123 so as to dissipate the heat to the atmosphere.

Figure 12B:
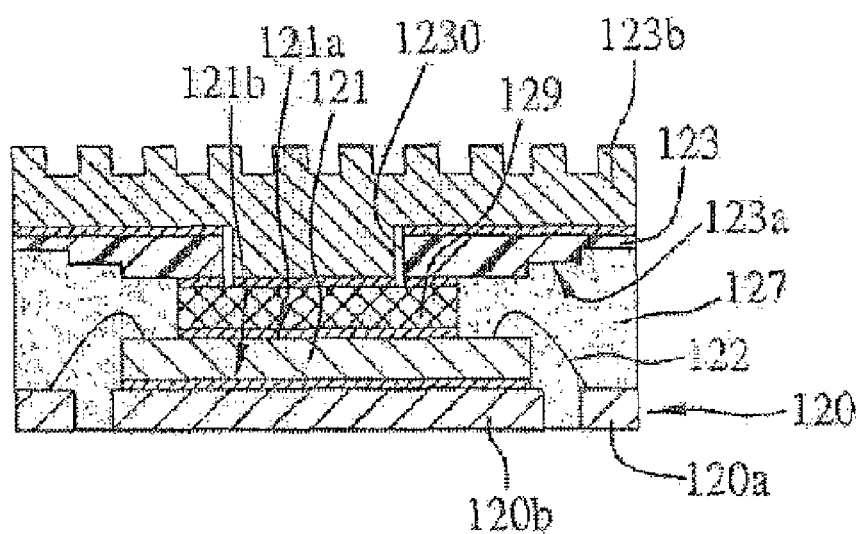

Further, as shown in FIG. 12B, a surface 123a of the heat spreader 123 in contact with the encapsulant 127 can be made uneven and/or subjected to a black oxidation treatment so as to enhance the bonding between the heat spreader 123 and the encapsulant 127. Moreover, a heat-dissipating structure 123b can be mounted on the heat spreader 123 via a thermally conductive adhesive layer, allowing the heat-dissipating structure 123b to be extended to and come into contact with the part of the buffer pad 129 exposed to the hollow structure 1230 of the heat spreader 123 such that heat produced by operation of the chip 121 can be dissipated through the heat-dissipating structure 123b.

Therefore, by the heat dissipating package structure and the method for fabricating the same in the present invention, a semiconductor chip is mounted and electrically connected to a chip carrier, and a heat spreader having a hollow structure and attached to an interface layer is mounted on the semiconductor chip, wherein the interface layer seals one side of the hollow structure of the heat spreader, and the semiconductor chip is larger in size than the hollow structure of the heat spreader. Preferably, a peripheral portion of the semiconductor chip is attached to the heat spreader and a central portion of the semiconductor chip is exposed to the hollow structure, so as to reduce thermal resistance from an adhesive layer between the semiconductor chip and the heat spreader and allow the semiconductor chip to directly come into contact with the atmosphere to thereby improve the heat dissipating efficiency. Then, a molding process is performed to form an encapsulant for completely encapsulating the semiconductor chip on the chip carrier and the heat spreader with the interface layer. A singulation process is performed to remove peripheral non-electrical functional portions of a package unit. Subsequently, a part of the encapsulant formed on the heat spreader is removed. As the interface layer has larger adhesion with the encapsulant than with the heat spreader, the interface layer and the part of the encapsulant on the interface layer can be removed together, without leaving any residue of the interface layer on the package unit, such that the heat spreader is directly exposed and the semiconductor chip is partly exposed to the hollow structure of the heat spreader, thereby improving the heat dissipating efficiency due to direct contact between the semiconductor chip and the atmosphere. Further, the present invention can be accomplished by a batch-type manner, thereby simplifying the fabrication processes, reducing the packaging time and costs, preventing chip cracking or flashes in the molding process to cause impair appearance of the fabricated product or increase in deflashing costs, and having no concern for height control during the process of attaching the heat spreader to the semiconductor chip and for changing an encapsulation mold in response to change of a product size. As a result, packaging costs and equipment management costs are reduced in the present invention.

The invention has been described using exemplary preferred embodiments. However, it is to be understood that the scope of the invention is not limited to the disclosed embodiments. On the contrary, it is intended to cover various modifications and similar arrangement. The scope of the claims therefore should be accorded the broadest interpretation so as to encompass all such modifications and similar arrangements.

What is claimed is:

1. A heat dissipating package structure, comprising:
   at least one chip carrier;
   a semiconductor chip mounted and electrically connected to the chip carrier;
   a heat spreader, having a hollow structure, directly adhered on the semiconductor chip and being free of contacting the chip carrier, wherein the semiconductor chip is larger in size than the hollow structure and a central portion of the semiconductor chip is exposed to the hollow structure of the heat spreader, wherein the hollow structure exposes more than 25% of the back surface of the semiconductor chip; and
   an encapsulant, formed between the heat spreader and the chip carrier but not formed in the hollow structure, for encapsulating the semiconductor chip.

2. The heat dissipating package structure of claim 1, wherein the chip carrier is a substrate or a lead frame, and the at least one chip carrier comprises an array of chip carriers, a strip of chip carriers, or at least one single chip carrier.

3. The heat dissipating package structure of claim 1, wherein the chip is electrically connected to the chip carrier in a wire-bonding or flip-chip manner.

4. The heat dissipating package structure of claim 1, wherein sides of the heat spreader are exposed from the encapsulant and are flush with sides of the encapsulant.

5. The heat dissipating package structure of claim 1, wherein a plurality of conductive elements are formed on a lower surface of the chip carrier so as to electrically connect the semiconductor chip to an external device via the conductive elements.

6. The heat dissipating package structure of claim 1, wherein a surface of the heat spreader in contact with the encapsulant is made uneven.

7. The heat dissipating package structure of claim 1, further comprising a heat-dissipating structure mounted on the heat spreader, wherein the heat-dissipating structure is extended to and comes into contact with the part of the semiconductor chip exposed to the hollow structure of the heat spreader.

* * * * *